(12) United States Patent
Anazawa

(10) Patent No.: US 6,745,378 B2
(45) Date of Patent: Jun. 1, 2004

(54) WIRING DESIGNING METHOD

(75) Inventor: Tetsuya Anazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 244 days.

(21) Appl. No.: 10/097,728

(22) Filed: Mar. 15, 2002

(65) Prior Publication Data

US 2003/0046647 A1 Mar. 6, 2003

(30) Foreign Application Priority Data

Sep. 5, 2001 (JP) ......................... 2001-269205

(51) Int. Cl.⁷ ................................. G06F 9/45
(52) U.S. Cl. ........................... 716/10; 716/14
(58) Field of Search ...................... 716/10, 14

(56) References Cited

U.S. PATENT DOCUMENTS 6,202,191 B1 * 3/2001 Filippi et al. ................ 716/5
6,417,572 B1 * 7/2002 Chidambarrao et al. .... 257/773
6,448,173 B1 * 9/2002 Clevenger et al. .......... 438/627
2001/0027010 A1 * 10/2001 Jang et al. ................... 438/626

* cited by examiner

*Primary Examiner*—Stacy A. Whitmore
(74) *Attorney, Agent, or Firm*—Westerman, Hattori, Daniels & Adrian, LLP

(57) ABSTRACT

First, stripe wirings A and B are set virtually intersect each other. A width of a strand of each of the stripe wirings A and B is set equal to/lower than a maximum line width decided by constraints imposed on a manufacturing process. Then, lengths of the strands in intersection portion of the stripe wirings A and B are compared with each other, and a longer strand is set as a strand to be changed for position. However, it is only a part of the strand in the intersection portion that is changed for position. Subsequently, an intersection point of center lines X and Y of the stripe wirings A and B is set as a reference position, and the strand to be changed for position is moved in a direction away from the reference position to a position where an occupancy rate of a wiring becomes equal to/smaller than a maximum occupancy rate of a wiring decided by constraints imposed on the manufacturing process.

16 Claims, 17 Drawing Sheets

WIRING DESIGNING METHOD

CROSS-REFERENCE TO RELATED APLICATIONS

This application is based upon and claims priority of Japanese Patent Applications No. 2001-269205, filed in Sep. 5, 2001, the contents being incorporated herein by reference.

BACKGROUND OF THE INVENTION

1. Field of the Invention

The present invention relates to a wiring designing method for a semiconductor integrated circuit and, more particularly, to a structure of an intersection portion of stripe wiring, each of which is composed of a plurality of strands limited to a fixed width or lower, and a method of designing the same.

2. Description of the Prior Art

In recent years, with promotion of much higher integration of a semiconductor integrated circuit, a copper wiring has replaced an aluminum wiring that had mainly been used. The copper wiring has advantages of a lower value of resistance, and higher resistance to electromigration compared with an aluminum wiring having an equal width, and thus it is suitable for forming a micro-wiring.

The copper wiring is generally formed by a method called a damascene method (or dual damascene method). According to the damascene method, the copper wiring is formed in such a manner that a trench is formed in an insulating film on a semiconductor substrate, and copper is embedded in the trench by use of a method such as plating, followed by removing a portion of the copper on the insulating film by a chemical mechanical polishing (CMP) method, while leaving a portion of the copper in the trench.

The inventors of this application consider that there are the following problems in a conventional wiring designing method. That is, mounting narrow and wide wirings mixedly on the same substrate makes it difficult to perform uniform polishing by the CMP method. For example, if CMP polishing is performed according to the wide wiring, the narrow wiring becomes thin.

To solve such a problem, a limitation must be placed on a width of wiring, and widths of all wirings must be set equal to a limit value (referred to as maximum line width, hereinafter) or lower. For a similar reason, an occupancy rate of a wiring per unit area must be set so as not to exceed a maximum occupancy rate of a wiring decided by constraints imposed on a manufacturing process. Specifically, in the case of a wiring arrangement, through which a large current flows, as shown in FIG. 1, the wiring is divided into a plurality of wirings narrower than the maximum line width, and a space between the wirings is set so as not to exceed the maximum occupancy rate of a wiring. Hereinafter, the plurality of wirings connected in parallel as shown in FIG. 1 are called strands, and a collection of these strands is called a stripe wiring.

For example, in an intersection (connection) portion of two stripe wirings, simple intersection of the two stripe wirings results in a state like that shown in FIG. 2, where a maximum occupancy rate of a wiring per unit area is exceeded in the intersection portion of the two stripe wirings A and B. Conventionally, therefore, any one of the following methods has been employed: thinning strands in the intersection portion so as not to exceed the maximum occupancy rate of a wiring, shown in FIG. 3; and formation of a connecting wiring 53 in the other wiring layer, and electrical connection of strands 51 and 52 of the stripe wirings A and B with each other through a wiring 53 and a contact hole 54, shown in FIG. 4.

However, thinning the strands in the intersection portion shown in FIG. 3 may cause excessive supplying of current to partial strands, or limit the amount of current to be supplied to the stripe wirings, making it impossible to supply a necessary amount of current. In the case of the formation of the connecting wiring 53 in the other wiring layer shown in FIG. 4, no limitations are imposed on the amount of current, but the use of the other wiring layer reduces a degree of freedom for wiring designing.

SUMMARY OF THE INVENTION

Objects of the present invention are to provide a wiring structure and a wiring designing method capable of providing a high degree of freedom of wiring designing, setting an occupancy rate of a wiring per unit area in an intersection portion of two stripe wiring equal to/lower than a maximum occupancy rate of a wiring, and supplying a necessary amount of current.

In accordance with an aspect of the invention, a wiring designing method of the present invention is provided for designing an intersection portion of stripe wirings composed of a plurality of strands limited to a fixed width or lower. This method comprises the steps of: setting first and second stripe wirings composed of a plurality of strands limited to a fixed width or lower to virtually intersect each other; setting a strand belonging to any one of the first and second stripe wiring among the strands in the intersection portion of the first and second stripe wirings to be changed for position; deciding a reference position; and moving the strand to be changed for position in a direction away from the reference position to a position where an occupancy rate of a wiring for each of the first and second stripe wirings in the intersection portion becomes equal to/lower than at least a maximum occupancy rate of a wiring decided by constraints imposed on a manufacturing process.

In accordance with another aspect of the invention, a wiring designing method of the present invention is provided for designing an intersection portion of stripe wirings composed of a plurality of strands limited to a fixed width or lower. This method comprises the steps of: setting first and second stripe wirings to virtually intersect each other; forming L-shaped strands by connecting strands of one having a smaller number of strands, of the first and second stripe wirings, sequentially from an outer strand with strands of the other stripe wiring; forming auxiliary strands from corners of the L-shaped strands in a direction perpendicular to center lines of the first and second stripe wirings; deciding a reference position; and moving the auxiliary strands in a position away from the reference position to positions where an occupancy rate of a wiring for each becomes equal to/smaller than a maximum occupancy rate of a wiring decided by constraints imposed on a manufacturing process.

In accordance with yet another aspect of the invention, a semiconductor device of the present invention is provided, comprising: a first stripe wiring composed of a plurality of strands limited to a fixed width or lower; and a second stripe wiring composed of a plurality of strands limited to a fixed width or lower, and having an intersection portion with the first stripe wiring. In this case, a space between those among strands in the intersection portion, belonging to one of the first and second stripe wiring, is set wider than a space between strands in a portion other than intersection portion, belonging to the same stripe wiring.

According to the semiconductor device of the present invention, the first and second stripe wirings are set to virtually intersect each other, positions of the strands in the intersection portion between the first and second stripe wirings are shifted in a manner that an occupancy rate of a wiring per unit area becomes equal to/lower than a maximum occupancy rate of a wiring, and strands are formed in the intersection portion and its vicinity according to a predetermined reference.

Thus, according to the present invention, since the first and second stripe wirings are connected with each other in one wiring layer without using any other wiring layers, a degree of freedom of wiring designing is increased. Moreover, according to the present invention, since no thinning is carried out for the strands in the intersection portion between the stripe wiring, it is possible to prevent excessive supply of current to partial strands and a limitation placed on the amount of current to be supplied to the stripe wiring, thus a necessary amount of current can be supplied. As a result, it is possible to secure wiring reliability.

DESCRIPTION OF THE PREFERRED EMBODIMENTS

Next, description will be made of the preferred embodiments of the present invention with reference to the accompanying drawings.

(First Embodiment)

Figure 9:
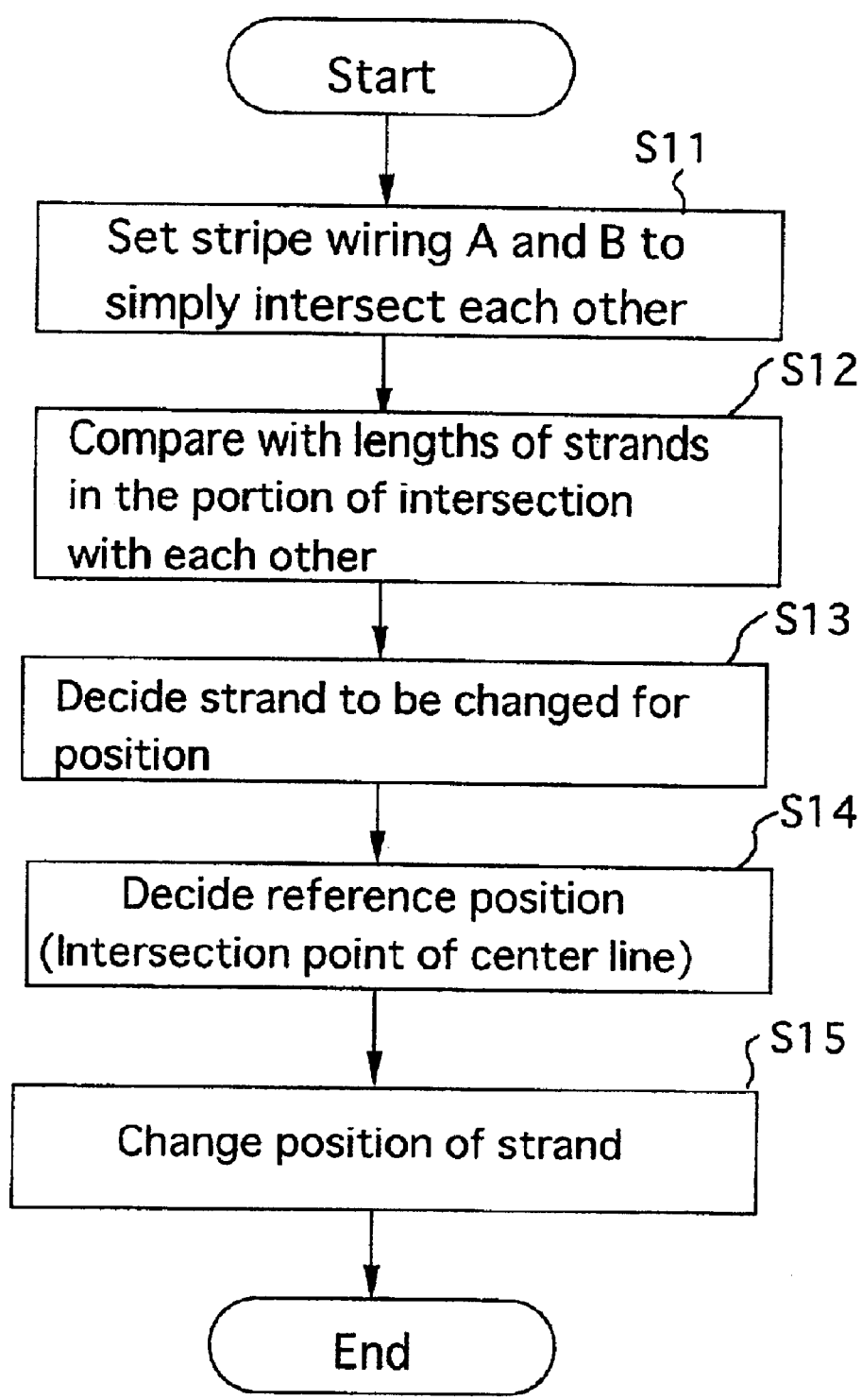
FIG. 9 is a flowchart showing the wiring designing method of the first embodiment.

FIGS. 5 to 8 are schematic views, each thereof showing a wiring designing method according to a first embodiment of the present invention: and FIG. 9 is a flowchart showing the wiring designing method of the present embodiment.

The present embodiment shows an example in which the present invention is applied to the design of an intersection (connection) portion of an end of a stripe wiring A composed of four strands 11 mutually arranged in parallel, and a stripe wiring B composed of five strands 12 mutually arranged in parallel.

Widths of the strands 11 and 12 of the stripe wirings A and B are all set equal to/lower than a maximum line width a (e.g., 3 $\mu$m) decided by constraints imposed on a manufacturing process. In addition, spaces between each strand 11 and between each strand 12 are set such that an occupancy rate of a wiring per unit area for each of the stripe wirings A and B can be smaller than a maximum occupancy rate b of a wiring (e.g., 80%) decided by constraints imposed on the manufacturing process.

Figure 1:
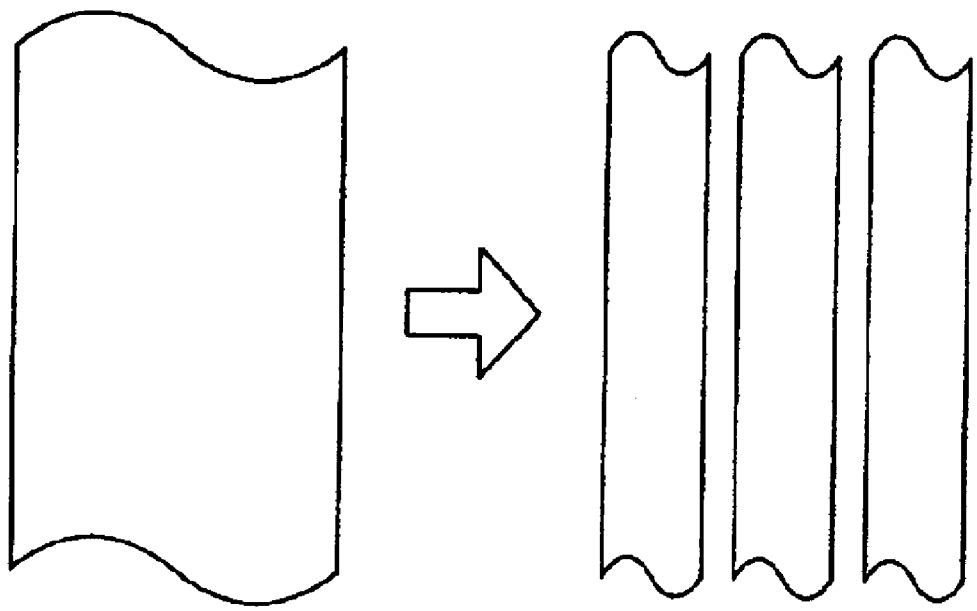
FIG. 1 is a schematic view showing an example of dividing a wide wiring into a plurality of wirings narrower than a maximum line width.
Figure 2:
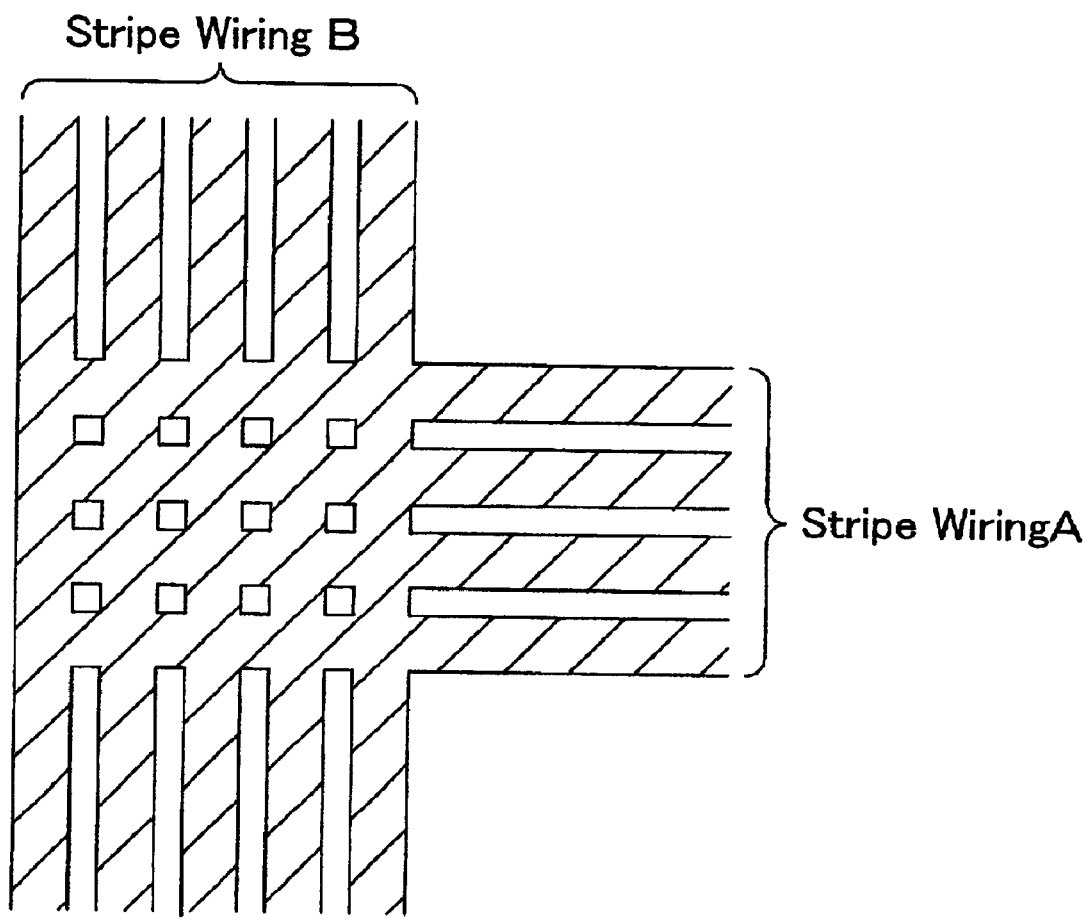
FIG. 2 is a schematic view showing an example of simple intersection of two stripe wirings.
Figure 3:
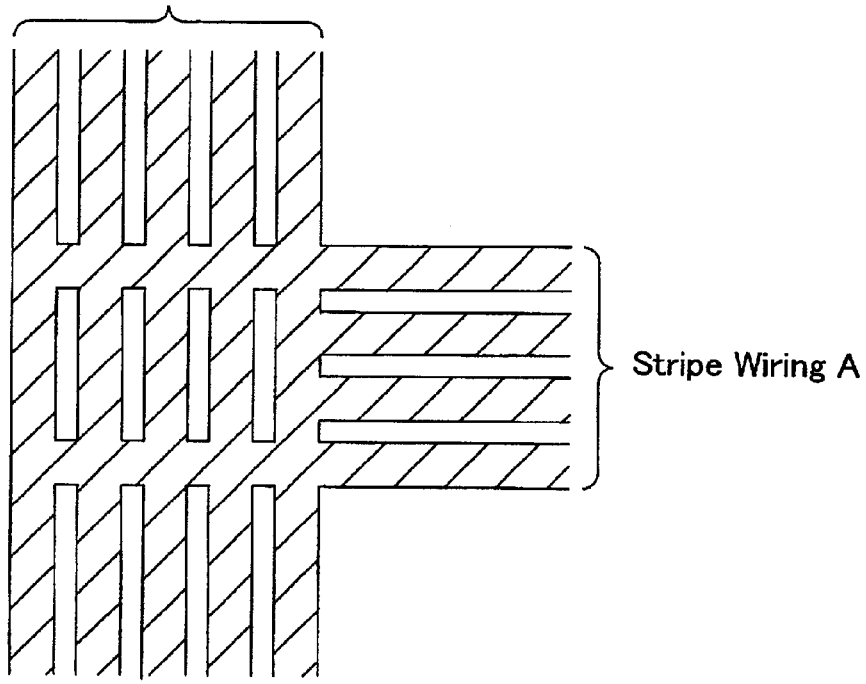
FIG. 3 is a schematic view showing an example of thinning strands of the two stripe wirings in an intersection portion.
Figure 4:
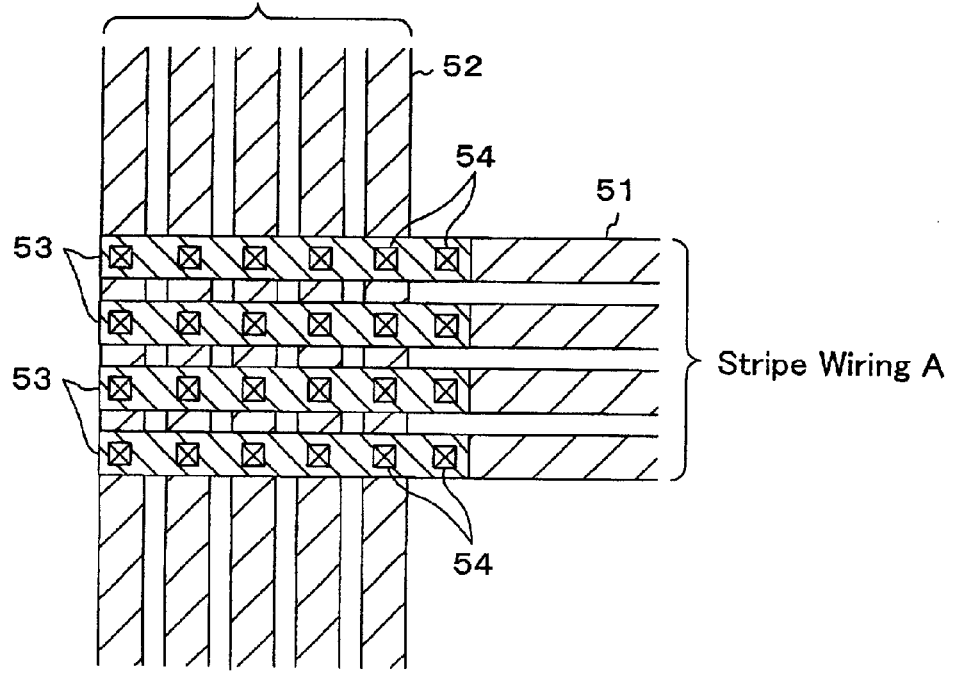
FIG. 4 is a schematic view showing an example of connecting the two stripe wirings by using a connecting wiring formed in the other wiring layer, and a contact hole.
Figure 5:
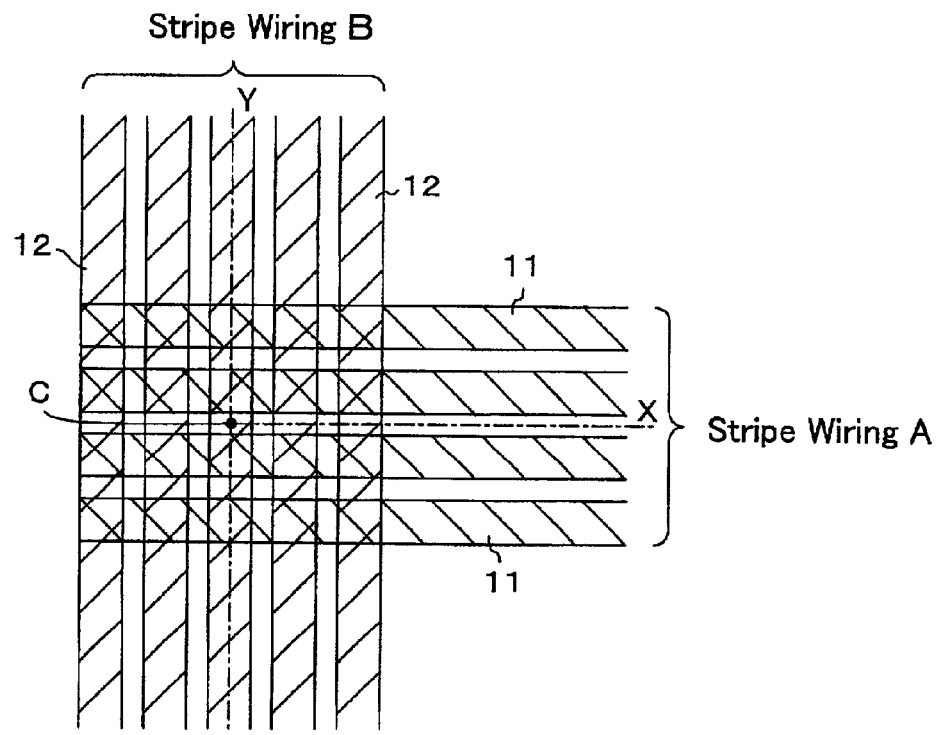
FIG. 5 is a schematic view (1) showing a wiring designing method of a first embodiment of the present invention.

First, as shown in FIG. 5, virtually, the stripe wirings A and B are set simply intersect each other in predetermined positions (step S11). In this state, an occupancy rate of a wiring in the intersection portion exceeds the maximum occupancy rate b of a wiring.

Then, a length W1 (see FIG. 7) of the strand 11 of the stripe wiring A is compared with a length W2 (see FIG. 8) of the strand 12 of the stripe wiring B in the intersection portion (step S12), and the longer strand is set as a strand to be changed for position (step S13). Here, since the length W1 of the strand 11 of the stripe wiring A is longer than the length W2 of the strand 12 of the stripe wiring B, the strand 11 of the stripe wiring A is set as a strand to be changed for position. However, a part of the strand 11 to be changed for position is only intersection portion of the stripe wirings A and B. Hereinafter, the part of the strand 11 to be changed for position is referred to as a strand 11a (see FIG. 7).

If the lengths W1 and W2 of the stripe wirings A and B in the intersection portion are equal to each other, an optionally selected strand of any one of the stripe wirings, or strands of both are set as strands to be changed for position.

Figure 6:
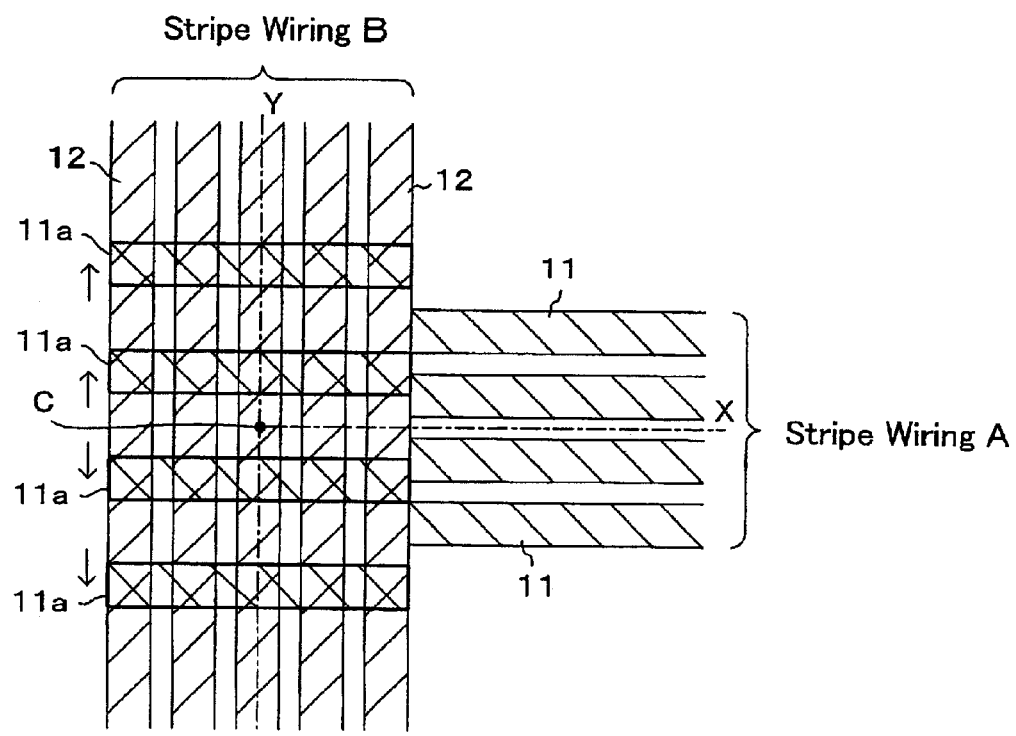
FIG. 6 is a schematic view (2) showing the wiring designing method of the first embodiment.
Figure 7:
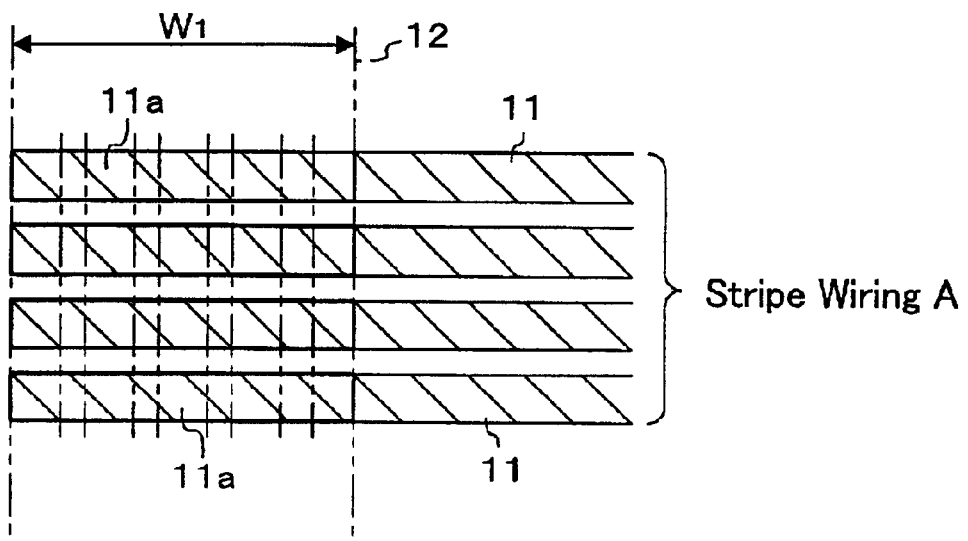
FIG. 7 is a schematic view (3) showing the wiring designing method of the first embodiment.
Figure 8:
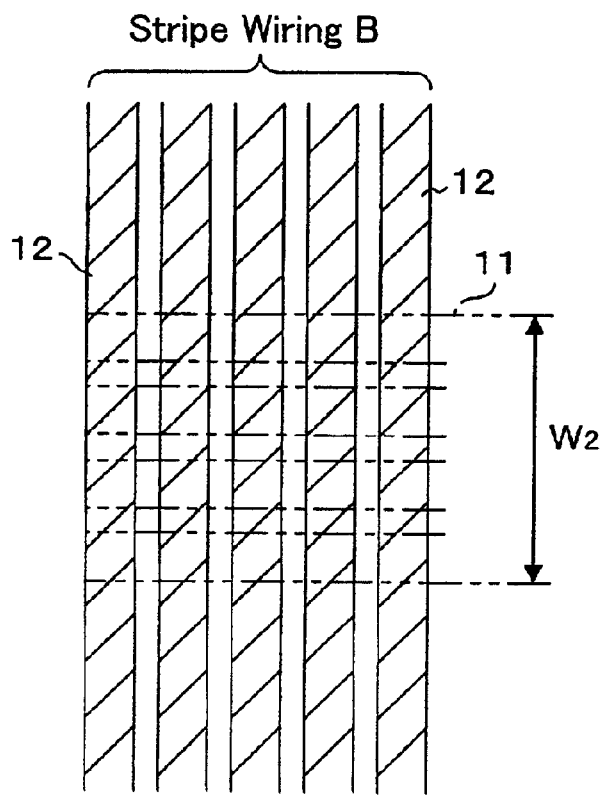
FIG. 8 is a schematic view (4) showing the wiring designing method of the first embodiment.
Figure 10:
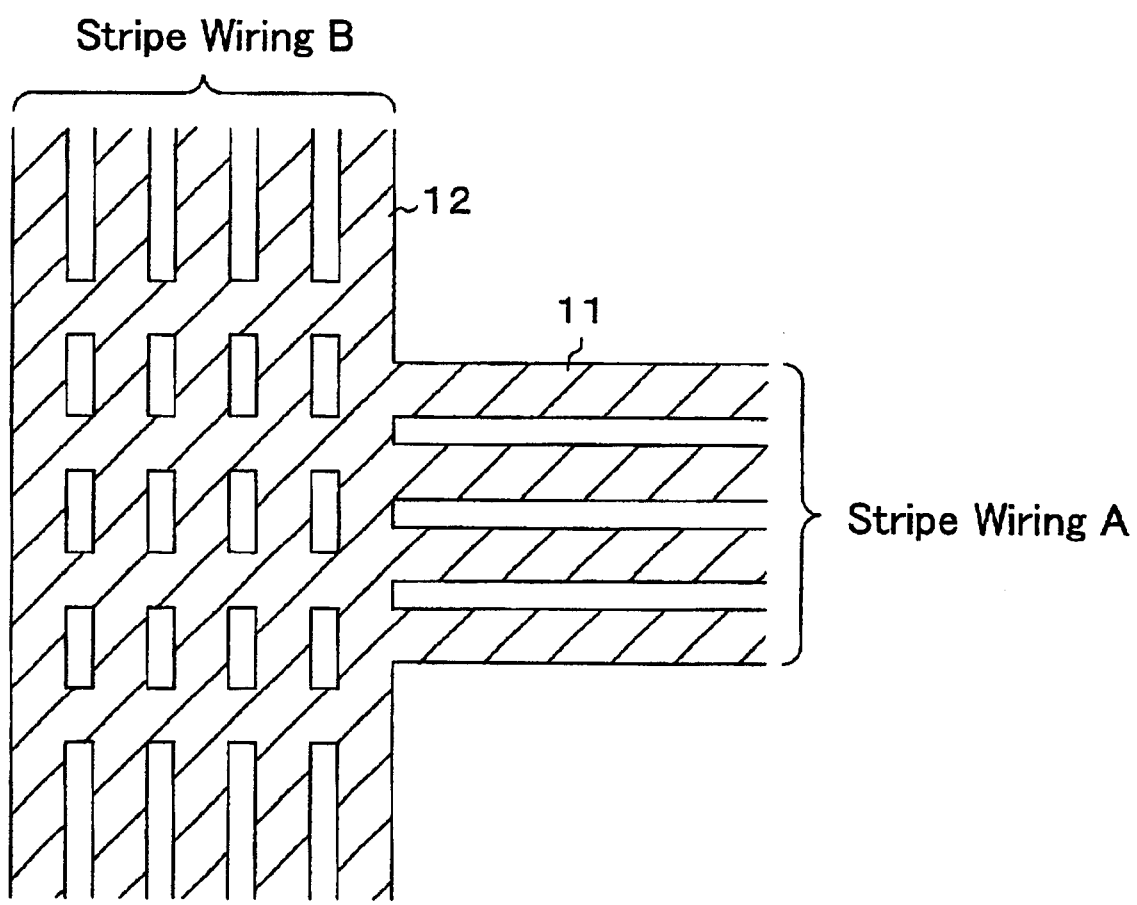
FIG. 10 is a view showing an intersection portion of the stripe wirings designed according to the first embodiment.

Then, a reference position for position changing is decided. Here, as shown in FIG. 5, an intersection portion of a center line X of the stripe wiring A and a center line Y of the stripe wiring B is set as a reference point C (step S14). Then, as shown in FIG. 6, a position of the strand 11a is shifted in a direction away from the reference position C until an occupancy rate of a wiring per unit area in each of the intersection portion of the stripe wirings A and B and the vicinity thereof becomes smaller than the maximum occupancy rate b of a wiring (step S15). In this case, the strand 11a is shifted along the center line Y of the stripe wiring B so as not to be out of edges of the stripe wirings A and B. Accordingly, designing wiring in the intersection portion of the stripe wirings A and B is completed. FIG. 10 shows a wiring structure of an intersection portion of stripe wiring of a semiconductor device, designed according to the present embodiment.

According to the present embodiment, since the stripe wirings A and B are connected with each other in one wiring layer, no reduction occurs in a degree of freedom of wiring designing, which is otherwise caused by use of the other wiring layer for connecting the stripe wirings A and B. In addition, since the position of the strand 11a in the intersection portion is decided to satisfy the maximum occupancy rate of a wiring, no failures occur in the manufacturing process. Moreover, according to the present embodiment, only the position of the strand 11a of the intersection portion is shifted, and no strand thinning is carried out. Thus, failure of supplying a necessary amount of current caused by excessive flowing of current to partial strands or a limitation on the amount of current to be supplied to the stripe wirings can be prevented, and therefore it is possible to secure wiring reliability.

(Modified Example of the First Embodiment)

In the foregoing embodiment, reference was made to a case of a three-wiring junction, where the end of the stripe wiring A is connected with the stripe wiring B. However, the invention can also be applied to a four-wiring junction (crossed wirings).

Figure 11:
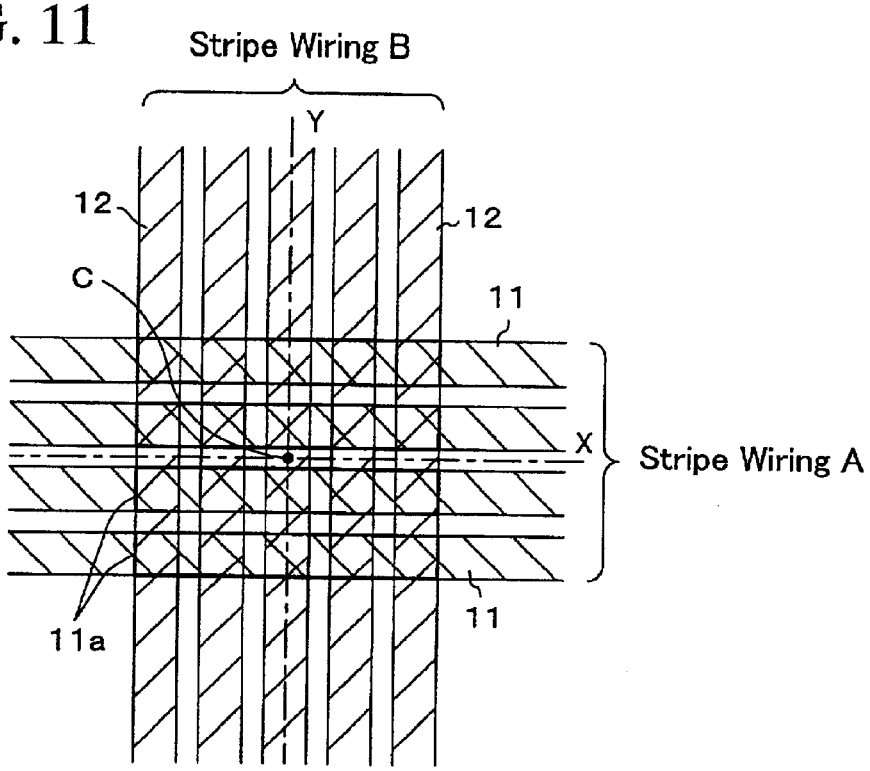
FIG. 11 is a schematic view (1) showing a wiring designing method of a modified example of the first embodiment.
Figure 12:
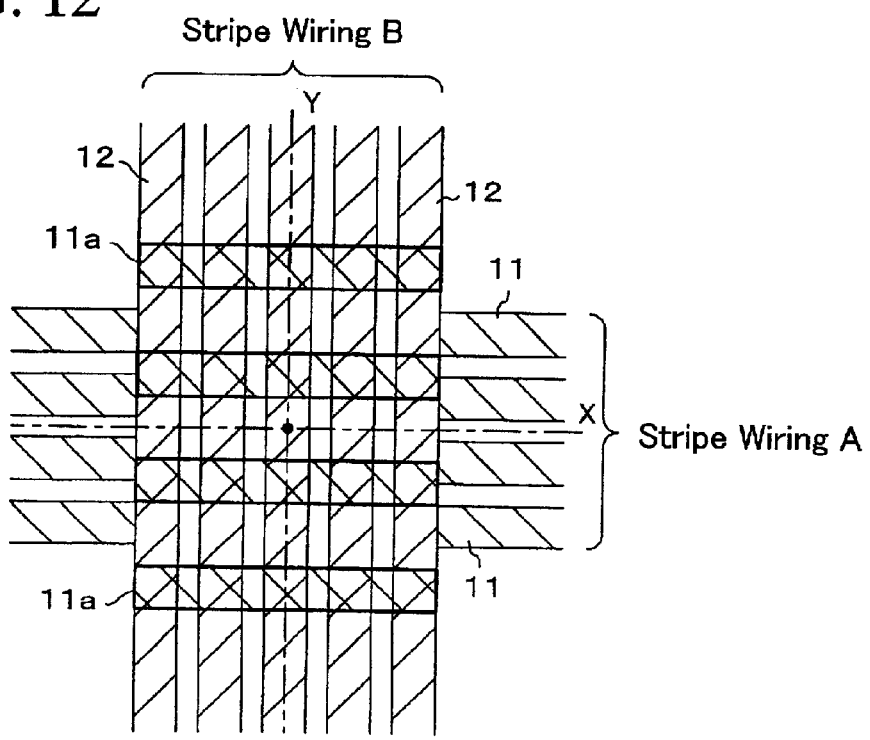
FIG. 12 is a schematic view (2) showing the wiring designing method of the modified example of the first embodiment.

FIGS. 11 and 12 show an example of a wiring designing method in the intersection portion of crossed stripe wirings A and B. The stripe wiring A is composed of four strands 11 mutually arranged in parallel; and the stripe wiring B is composed of five strands 12 mutually arranged in parallel. Hereinafter, description will be made by referring to FIG. 9, a flowchart, as in the case of the foregoing embodiment.

First, as shown in FIG. 11, virtually, the stripe wirings A and B are caused to simply intersect each other in predetermined positions (step S11). In this state, an occupancy rate of a wiring in the portion of intersection exceeds the maximum occupancy rate b of a wiring.

Then, a length of the strand 11 of the stripe wiring A is compared with a length of the strand 12 of the stripe wiring B (step S12) in the intersection portion, and the longer strand is set as a strand to be changed for position (step S13). In this example, the strand 11 of the stripe wiring A is set as a strand to be changed for position. However, a part of the strand 11 to be changed for position is only an intersection portion of the stripe wiring A and B. Hereinafter, the part of the strand 11 to be changed for position is referred to as a strand 11a.

Figure 13:
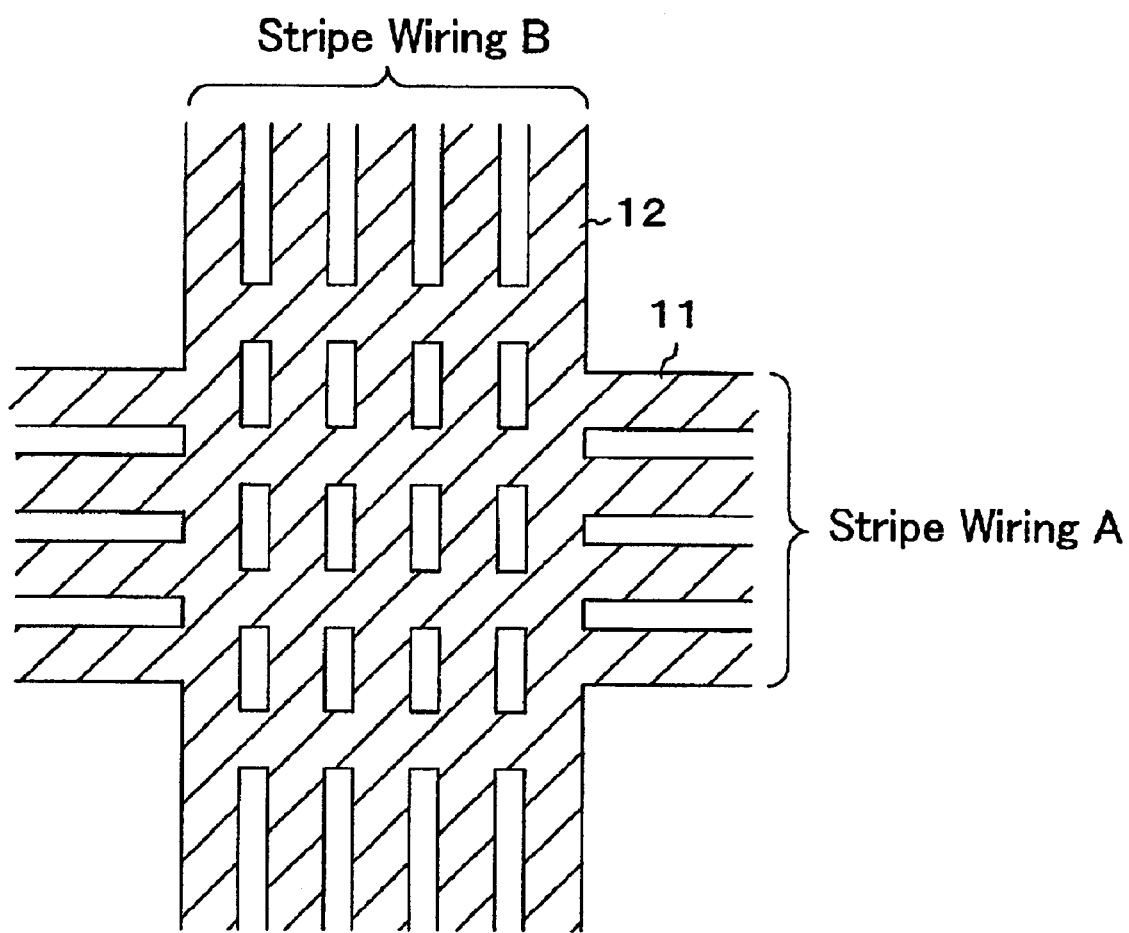
FIG. 13 is a view showing an intersection portion of the stripe wirings designed according to the modified example of the first embodiment.

Then, a reference position for position changing is decided. Here, an intersection portion of a center line X of the stripe wiring A and a center line Y of the stripe wiring B is set as a reference position C (step S14). Then, as shown in FIG. 12, a position of the strand 11a is shifted in a direction away from the reference position C until an occupancy rate of a wiring per unit area in each of the portion of intersection between the stripe wirings A and B and the vicinity thereof becomes smaller than the maximum occupancy rate b of a wiring (step S15). In this case, the strand 11a is shifted along the center line Y of the stripe wiring B so as not to be out of edges of the stripe wirings A and B. Accordingly, designing a wirings in the intersection portion of the stripe wrings A and B is completed. FIG. 13 shows a wirings structure of an intersection portion of stripe wirings of a semiconductor device, designed according to the modified example of the first embodiment.

(Second Embodiment)

Figure 14:
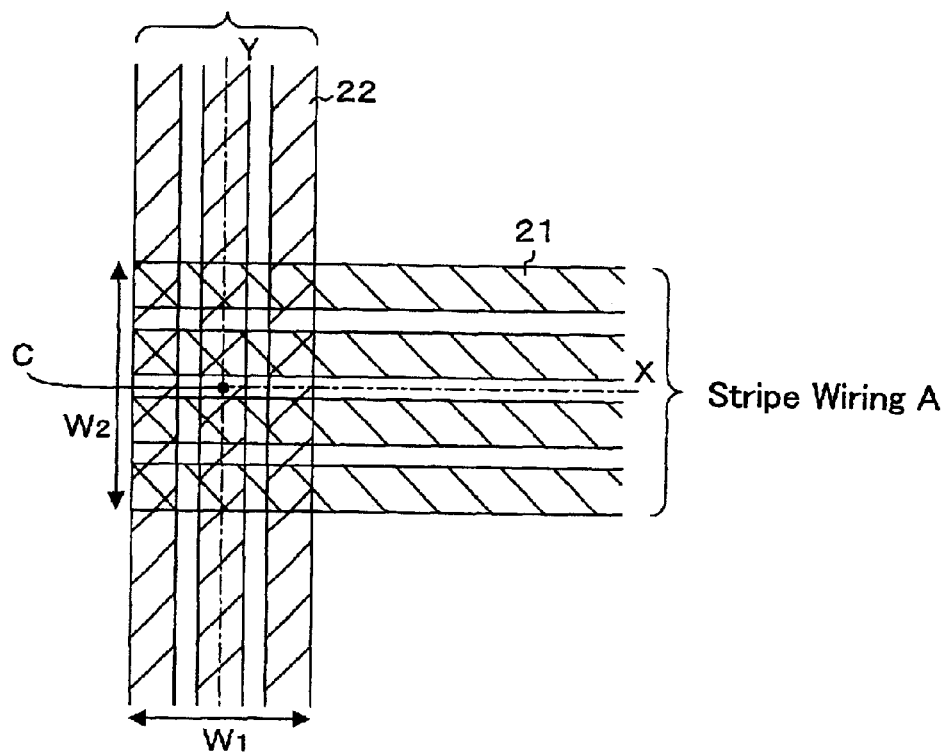
FIG. 14 a schematic view (1) showing a wiring designing method of a second embodiment of the present invention.
Figure 15:
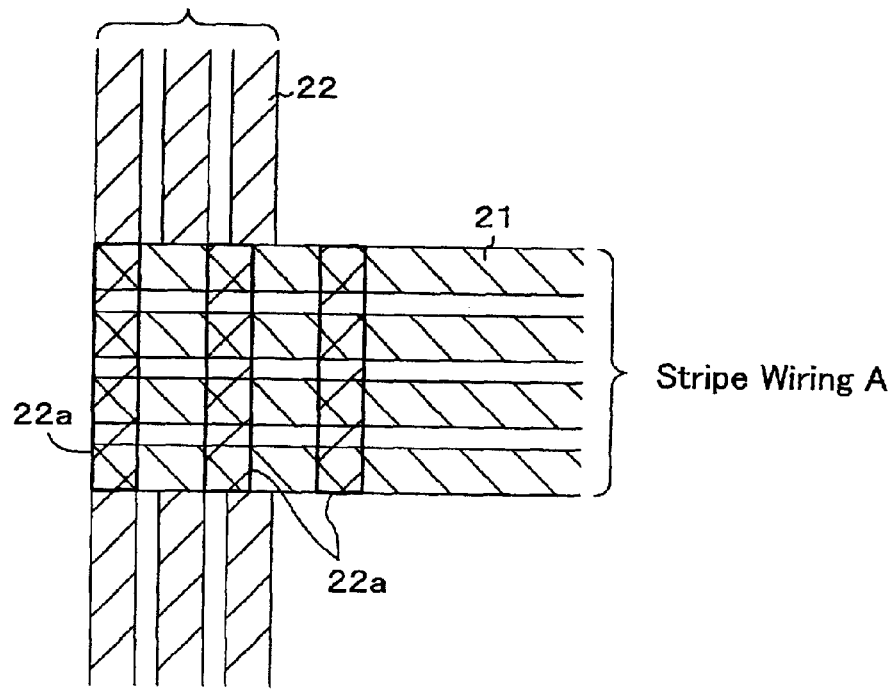
FIG. 15 is a schematic view (2) showing the wiring designing method of the second embodiment.
Figure 16:
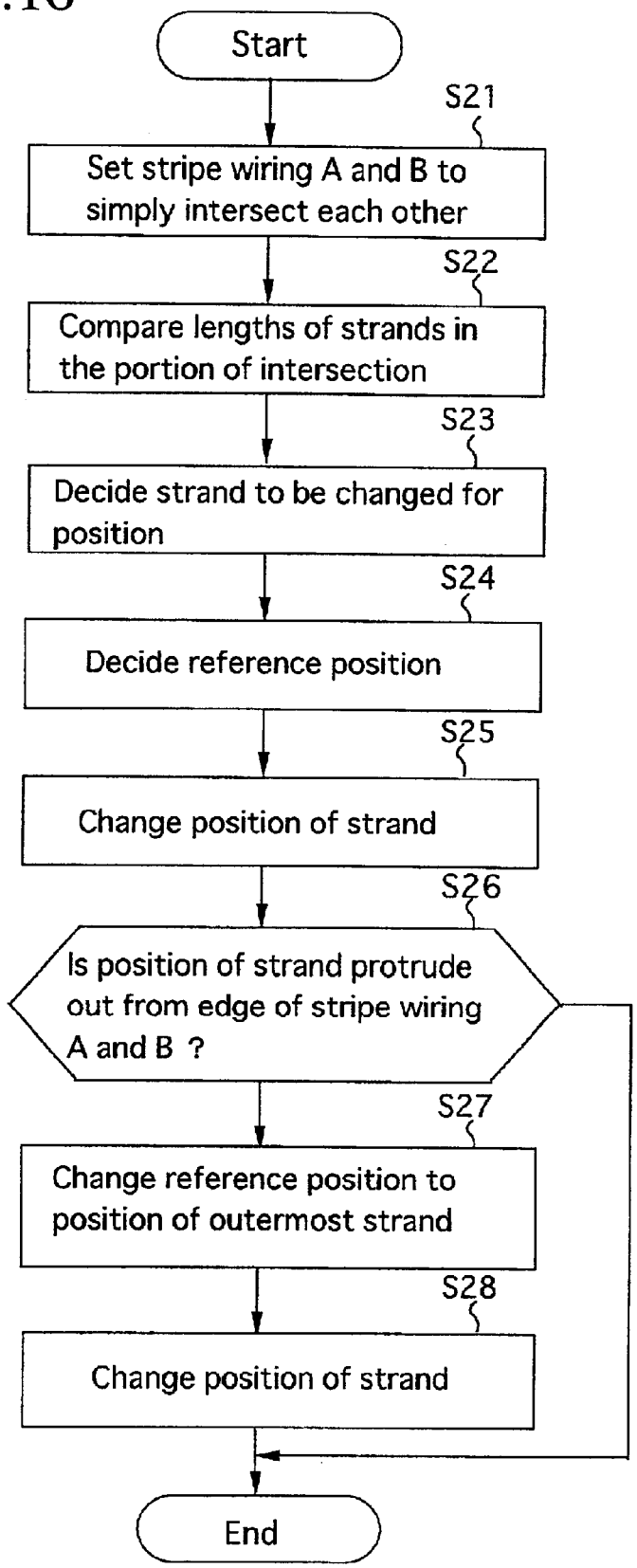
FIG. 16 is a flowchart showing the wiring designing method of the second embodiment.

FIGS. 14 and 15 are schematic views, each thereof showing a wiring designing method according to a second embodiment of the present invention: and FIG. 16 a flowchart showing the wiring designing method of the present embodiment.

The present embodiment shows an example in which the present invention is applied to the design of an intersection portion of an end of a stripe wiring A composed of four strands 21, and a stripe wiring B composed of three strands 22.

Also in the present embodiment, widths of the strands 21 and 22 of the stripe wirings A and B are all set equal to/lower than a maximum line width a (e.g., 3 μm) decided by constraints imposed on a manufacturing process. In addition, spaces between each strand 21 and between each strand 22 are respectively set such that an occupancy rate of a wiring per unit area for each of the stripe wirings A and B can be smaller than a maximum occupancy rate b of a wiring (e.g., 80%) decided by constraints imposed on the manufacturing process.

First, as shown in FIG. 14, virtually, the stripe wirings A and B is set simply intersect each other in predetermined positions (step S21). In this state, an occupancy rate of a wiring in the intersection portion exceeds the maximum occupancy rate b of a wiring.

Then, a length W1 of the strand 21 of the stripe wiring A in the intersection portion is compared with a length W2 of the strand 22 of the stripe wiring B (step S22), and the longer strand is set as a strand to be changed for position (step S23). Here, since the length W2 of the strand 22 of the stripe wiring B is longer than the length W1 of the strand 21 of the stripe wiring A, the strand 22 of the stripe wiring B is set as a strand to be changed for position. However, a part of the strand 22 to be changed for position is only an intersection portion of the stripe wirings A and B. Hereinafter, the part of the strand 22 to be changed for position is referred to as a strand 22a.

Then, a reference position for position changing is decided. Here an intersection portion of a center line X of the stripe wiring A and a center line Y of the stripe wiring B is set as a virtual reference point C (step S24). Then, in a direction away from the virtual reference position C, a position of the strand 22a is shifted along the center line X of the stripe wiring A until an occupancy rate of a wiring per unit area becomes smaller than the maximum occupancy rate b of a wiring (step S25).

Then, determination is made as to whether the strand 22a is protruded out or not from edges of the stripe wirings A and B (step S26). If the strand changed in position is not protruded out from the edges of the stripe wirings A and B, a processing flow is similar to that of the first embodiment, a position of the strand in the intersection portion is decided, and then the process is finished. In the present embodiment, however, since the strand 22a is protruded out from the edge of the stripe wiring B, the reference position must be changed.

Figure 17:
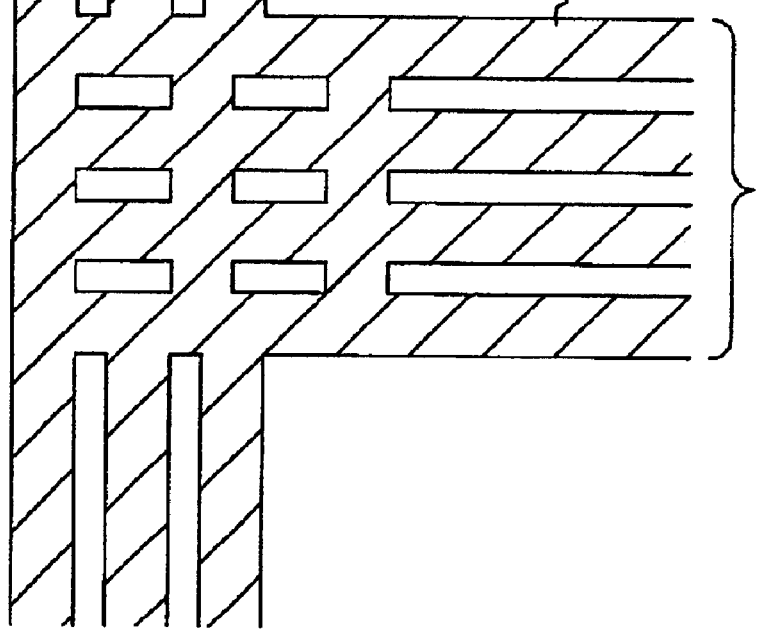
FIG. 17 is a view showing an intersection portion of stripe wiring designed according to the second embodiment.

In this case, among the three strands 22a to be changed in position, a position of the strand 22a disposed in the outermost side (the strand protruded out from the edge of the stripe wiring B when the point C is set as a reference position) is set as a reference position (step S27). Then, as shown in FIG. 15, in a direction away from the reference position, the remaining two strands 22a are shifted along the center line X of the stripe wiring A until an occupancy rate of a wiring per unit area becomes smaller than the maximum occupancy rate b of a wiring (step S28). Accordingly, designing wiring in the intersection portion of the stripe wirings A and B is completed. FIG. 17 shows an intersection portion of stripe wirings of a semiconductor device, designed according to the present embodiment.

According to the present embodiment, as in the case of the first embodiment, since the stripe wirings A and B are connected with each other in one wiring layer, no reduction occurs in a degree of freedom of wiring designing, which is otherwise caused by use of the other wiring layer. In addition, since the position of the strand is decided to satisfy the maximum occupancy rate of a wiring, no failures occur in the manufacturing process. Moreover, only the position of the strand 22a is shifted, and no strand thinning is carried out. Thus, failure of supplying a necessary amount of current caused by excessive flowing of current to partial strands or a limitation on the amount of current to be supplied to the stripe wirings can be prevented, and therefore it is possible to secure wiring reliability.

In the first and second embodiments, the longer strand is set to be changed for position in the intersection portion. However, the shorter strand can be changed for position. Note that, preferably, the longer strand should be set as a strand to be changed for position, because of reductions in an area of an entire portion of intersection, in the number of strands bent in paths thereof in the intersection portion, and the number of strands changed for position in a designing stage, facilitating wiring designing.

(Third Embodiment)

Figure 21:
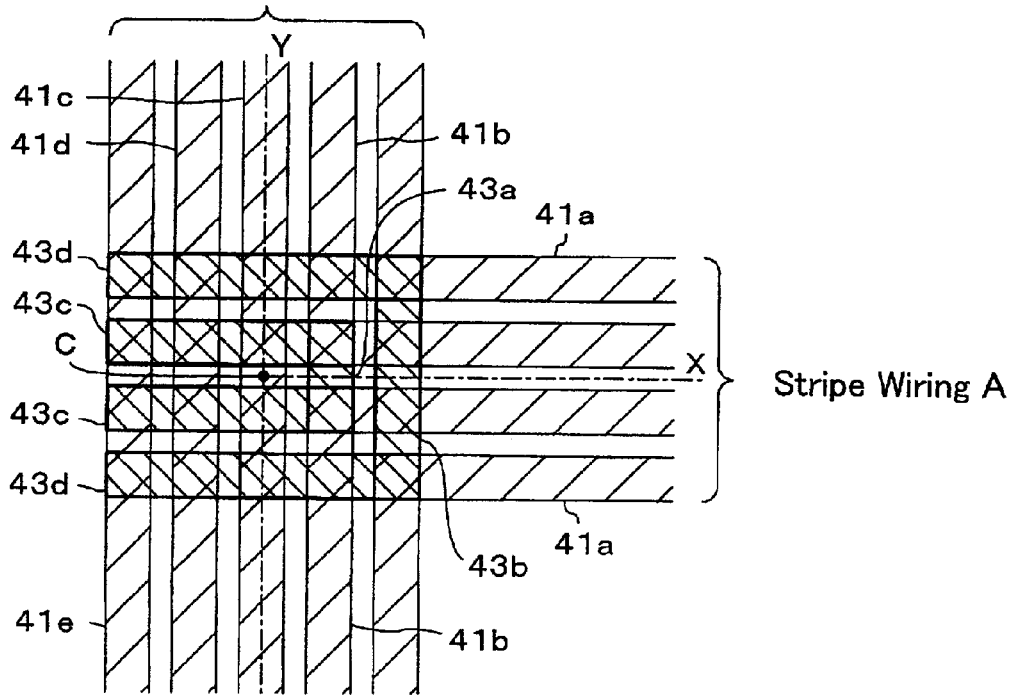
FIG. 21 is a schematic view (4) showing the wiring designing method of the third embodiment.
Figure 22:
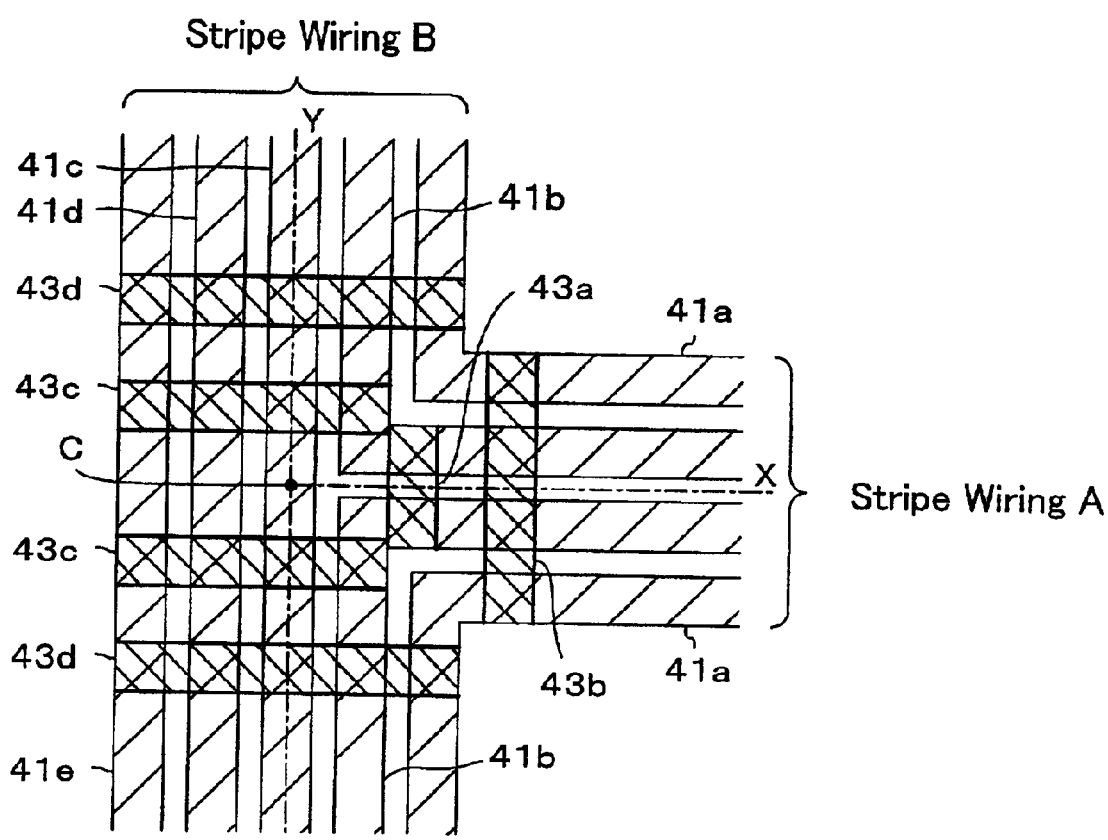
FIG. 22 is a schematic view (5) showing the wiring designing method of the third embodiment.
Figure 23:
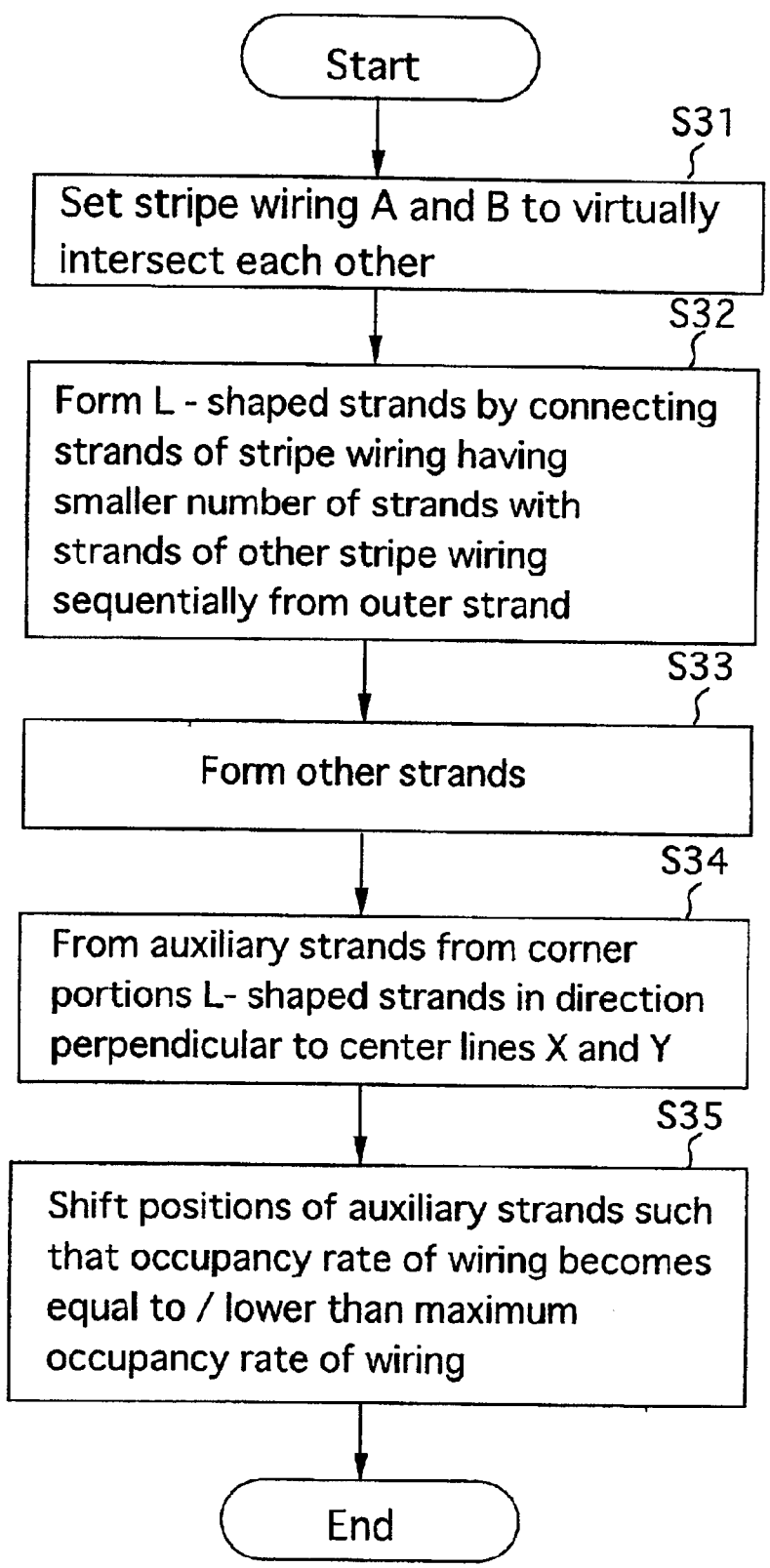
FIG. 23 is a flowchart showing the wiring designing method of the third embodiment.

FIGS. 18 to 22 are schematic views, each thereof showing a wiring designing method according to a third embodiment of the present invention: and FIG. 23 a flowchart showing the wiring designing method of the present embodiment.

The present embodiment shows an example in which the present invention is applied to the case where a stripe wiring B composed of five strands 32 mutually arranged in parallel intersects (is connected to) an end of a stripe wiring A composed of four strands 31 mutually arranged in parallel.

Widths of the strands 31 and 32 of the stripe wirings A and B is all set equal to/lower than a maximum line width a (e.g., 3 $\mu$m) decided by constraints imposed on a manufacturing process. In addition, spaces between the strands 31 and between the strands 32 are respectively set such that an occupancy rate of a wiring per unit area for each of the stripe wirings A and B can be smaller than a maximum occupancy rate b of a wiring (e.g., 80%) decided by constraints imposed on the manufacturing process.

Figure 18:
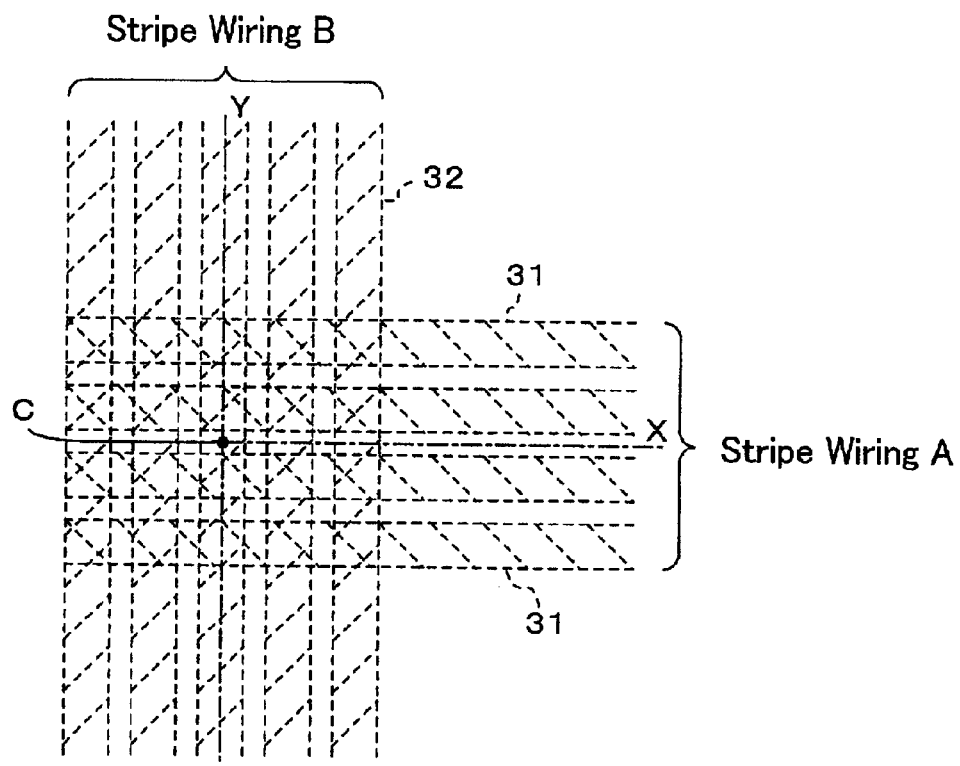
FIG. 18 is a schematic view (1) showing a wiring designing method of a third embodiment of the present invention.
Figure 19:
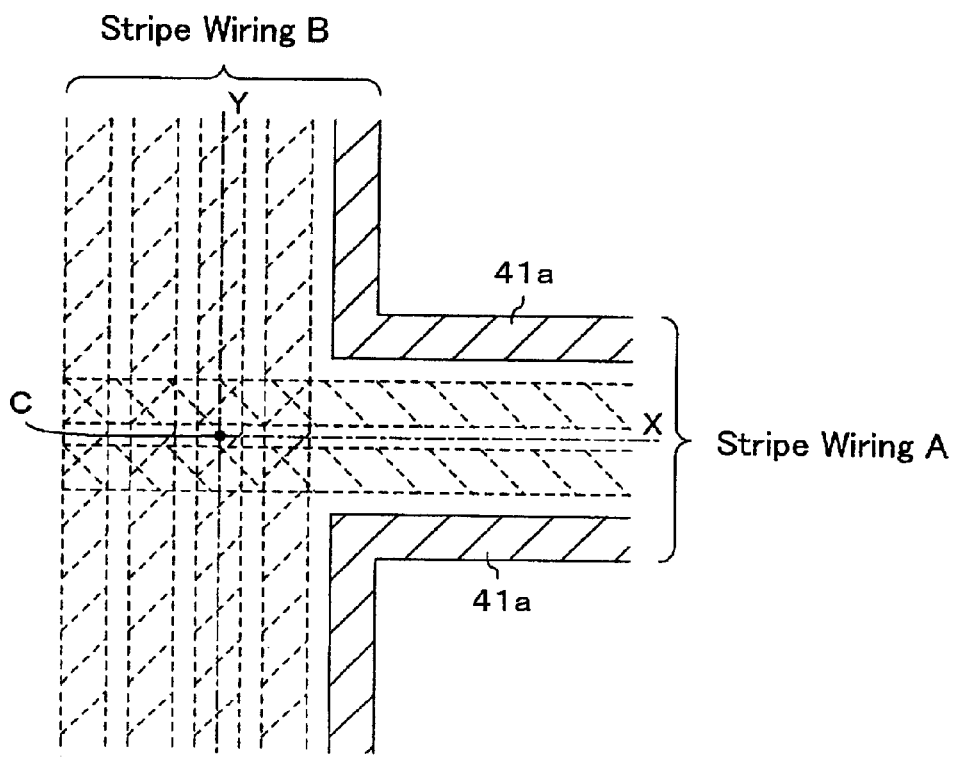
FIG. 19 is a schematic view (2) showing the wiring designing method of the third embodiment.
Figure 20:
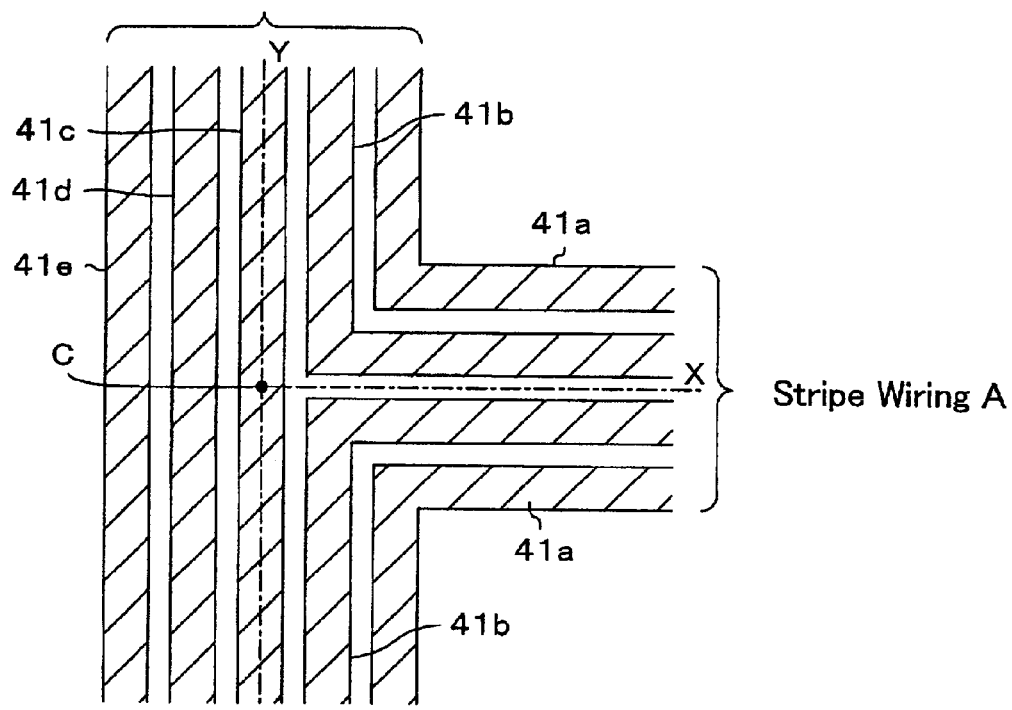
FIG. 20 is a schematic view (3) showing the wiring designing method of the third embodiment.

First, as shown in FIG. 18, virtually, the stripe wirings A and B is set intersect each other (step S31). Then, as shown in FIG. 19, an L-shaped strand 41a is formed by the outer strand 31 of the stripe wiring A having a smaller number of strands, and the outer strand 32 of the stripe wiring B. In addition, as shown in FIG. 20, an L-shaped strand 41b is formed by the second strand 31 from the outer side of the stripe wiring A, and the second strand 32 from the outer side of the stripe wiring B. Thus, the L-shaped strands 41a and 41b are formed by connecting the strands 31 of the striped wiring A having a smaller number of strands sequentially from the outer strand with the strands 32 of the stripe wiring B (step S32).

Then, as shown in FIG. 20, strands 41c to 41e are formed in positions of virtual strands 32 of the stripe wiring B, which are not connected with the strands 31 of the stripe wiring A (step S33).

Then, as shown in FIG. 21, auxiliary strands 43a to 43d are respectively formed from corners of the L-shaped strands 41a and 41b in directions perpendicular to center lines X and Y (step S34).

In this case, starting points of the auxiliary strands 43a to 43d are set at the corners of the L-shaped strands 41a and 41b; each end point are set at the center line X or Y if the L-shaped strands 41a and 41b are present in symmetrical position with respect to the center line X or Y; and if the L-shaped strands 41a and 41b are not present, ends points are set at edges of the striped wirings A and B. In addition, the auxiliary strands 43a to 43d are sequentially formed from the corner of the L-shaped strand 41a closest to a point of intersection C between the center lines X and Y of the stripe wirings A and B.

Figure 24:
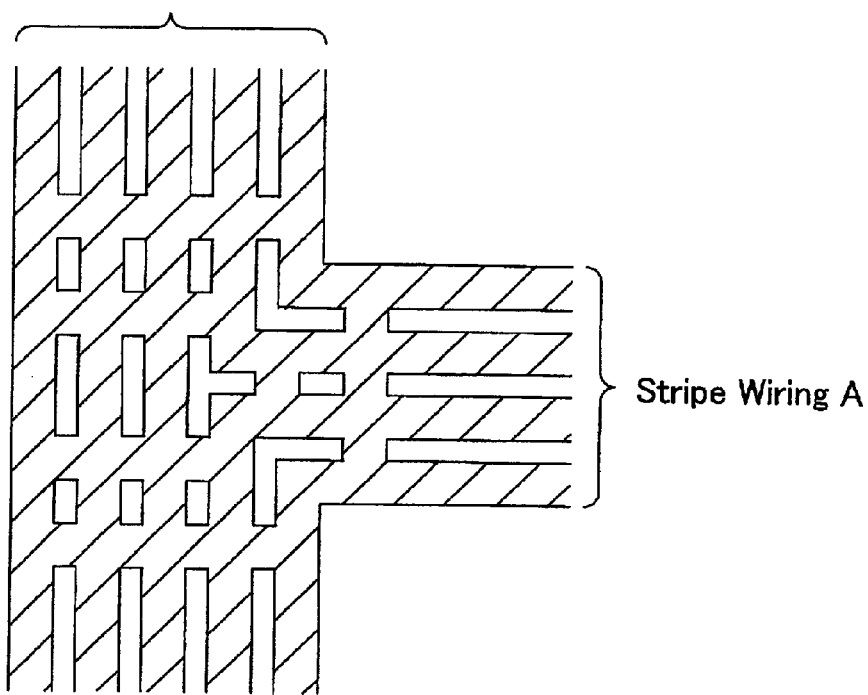
FIG. 24 is a view showing an intersection portion of stripe wirings designed according to the third embodiment.

Accordingly, disposing of the auxiliary strands 43a to 43d, as shown in FIG. 22, the auxiliary strands 43a to 43d are shifted along the center line X or Y in a direction away from the point of intersection C until an occupancy rate of a wiring per unit area becomes smaller than the maximum occupancy rate b of a wiring (step S35). Thus, designing wiring in the intersection portion of the stripe wirings A and B is completed. FIG. 24 shows a wiring structure of an intersection portion of stripe wiring of a semiconductor device, designed according to the present embodiment.

Also according to the present embodiment, since the stripe wirings A and B are connected with each other in one wiring layer, no reduction occurs in a degree of freedom of wiring designing, which is otherwise caused by use of the other wiring layer for connecting the stripe wirings A and B. In addition, since the positions of the auxiliary strands 43a to 43d of the portion of intersection are decided to satisfy the maximum occupancy rate of a wiring, no failures occur in the manufacturing process. Moreover, according to the present embodiment, failure of supplying a necessary amount of current caused by excessive flowing of current to partial strands or a limitation on the amount of current to be supplied to the stripe wirings can be prevented, and thus it is possible to secure wiring reliability.

Figure 25:
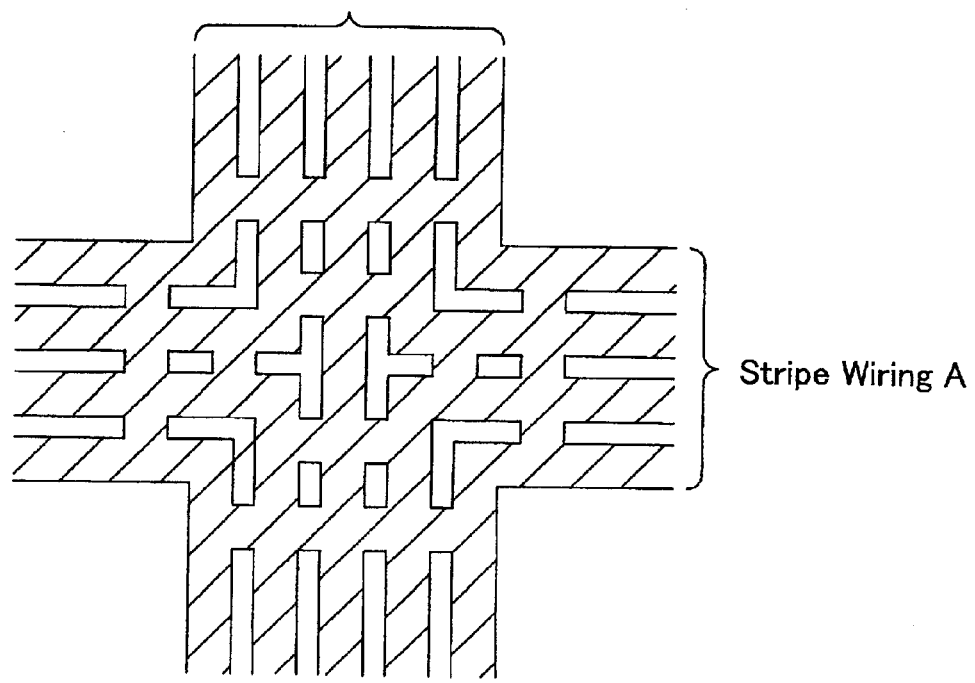
FIG. 25 is a view showing an intersection portion of the stripe wirings designed by applying the third embodiment to a case of a four-wiring junction.

In the third embodiment described above, description for the case where a three-wiring junction, where the end of the stripe wiring A is connected with the stripe wiring B. However, this invention can also be applied to a four-wiring junction (crossed wirings). FIG. 25 shows an intersection portion of between stripe wiring designed by applying the third embodiment to a case of such a four-wiring junction. Also in this case, designing the portion of intersection between stripe wirings is carried out according to the flowchart shown in FIG. 23.

What is claimed is:

1. A wiring designing method for designing an intersection portion of stripe wirings composed of a plurality of strands limited to a fixed width or lower, comprising:

a virtual intersection step for setting first and second stripe wirings composed of a plurality of strands limited to a fixed width or lower to virtually intersect each other;

a strand setting step for setting, among strands in intersection portion of the first and second stripe wirings, a strand belonging to any one of the first and second stripe wirings as a strand to be changed for position;

a reference position decision step for deciding a reference position; and a strand moving step for moving the strand to be changed for position in a direction away from the reference position to a position where an occupancy rate of a wiring for each of the first and second stripe wirings in the portion of intersection becomes equal to/lower than at least a maximum occupancy rate of a wiring decided by constraints imposed on a manufacturing process.

2. A wiring designing method according to claim 1, further comprising a strand length comparison step for comparing lengths of the strands of the first and second stripe wirings in the intersection portion with each other, wherein the longer strand is set as the strand to be changed for position.

3. A wiring designing method according to claim 1, wherein the reference position is set at an intersection point of center lines of the first and second stripe wirings.

4. A wiring designing method according to claim 1, wherein the reference position is set at a position of an outermost strand among the strands in the intersection portion.

5. A wiring designing method according to claim 1, wherein the strand to be changed for position is moved along a center line of the stripe wiring different from the stripe wiring, to which the strand to be changed for position belongs.

6. A wiring designing method for designing an intersection portion of stripe wirings composed of a plurality of strands limited to a fixed width or lower, comprising:

a virtual intersection step for setting first and second stripe wiring virtually intersect each other;

an L-shaped strand forming step for forming L-shaped strands by connecting strands of one having a smaller number of strands, of the first and second stripe wirings, with strands of the other stripe wiring sequentially from an outer strand;

an auxiliary strand forming step for forming auxiliary strands from corners of the L-shaped strands in a direction perpendicular to center lines of the first and second stripe wirings;

a reference position decision step for deciding a reference position; and an auxiliary strand moving step for moving the auxiliary strands in a position away from the reference position to positions where an occupancy rate of a wiring for each becomes equal to/smaller than a maximum occupancy rate of a wiring decided by constraints imposed on a manufacturing process.

7. A wiring designing method according to claim 6, wherein the reference position is set intersection portion of the center lines of the first and second stripe wirings.

8. A wiring designing method according to claim 6, wherein the auxiliary strands are formed sequentially from the corner of the L-shaped strand closest to the reference position.

9. A semiconductor device comprising:

a first stripe wiring composed of a plurality of strands limited to a fixed width or lower; and a second stripe wiring composed of a plurality of strands limited to a fixed width or lower, and having a portion of intersection with said first stripe wiring, wherein a space between those among strands in the portion of intersection, belonging to one of said first and second stripe wirings, is set wider than a space between strands in a portion other than the portion of intersection, belonging to the same stripe wiring.

10. A semiconductor device according to claim 9, wherein each of the strands belonging to said one of said first and second stripe wirings is a longer one among the strands in the portion of intersection of said first and second stripe wirings.

11. A semiconductor device according to claim 9, wherein each of the strands belonging to said one of said first and second stripe wirings is any one of a smaller number of strands among strands in the portion of intersection of said first and second stripe wirings.

12. A semiconductor device according to claim 9, further comprising L-shaped strands formed by connecting the strands of one having a smaller number of strands, of said first and second stripe wirings, with those of the other stripe wiring sequentially from an outer one of the strands.

13. A semiconductor device according to claim 9, wherein the space between the strands belonging to said one of said first and second stripe wirings is decided in a manner that an occupancy rate of a wiring for each of said first and second wirings in the portion of intersection becomes equal to/smaller than at least a maximum occupancy rate of a wiring decided by constraints imposed on a manufacturing process.

14. A semiconductor device according to claim 9, wherein the portion of intersection constitutes a three-wiring junction where an end of said first stripe wiring is connected to said second stripe wiring.

15. A semiconductor device according to claim 9, wherein the portion of intersection constitutes a four-wiring junction where said first and second stripe wiring intersect each other in predetermined positions.

16. A semiconductor device according to claim 9, wherein said first and second stripe wirings are connected with each other in the same wiring layer.

* * * * *